US007826288B2

(12) United States Patent
Arsovski et al.

(10) Patent No.: US 7,826,288 B2
(45) Date of Patent: *Nov. 2, 2010

(54) DEVICE THRESHOLD CALIBRATION THROUGH STATE DEPENDENT BURN-IN (75) Inventors: Igor Arsovski, Williston, VT (US); Harold Pilo, Underhill, VT (US); Michael A. Ziegerhofer, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 396 days.

This patent is subject to a terminal disclaimer.

(21) Appl. No.: 11/684,225

(22) Filed: Mar. 9, 2007

(65) Prior Publication Data

US 2008/0219069 A1 Sep. 11, 2008

(51) Int. Cl.
*G11C 29/00* (2006.01)
*G11C 7/06* (2006.01)
*G11C 11/413* (2006.01)
*G11C 29/50* (2006.01)
*G11C 29/06* (2006.01)
*G11C 11/412* (2006.01)

(52) U.S. Cl. ............... 365/202; 365/154; 365/205; 365/201; 365/207

(58) Field of Classification Search ............... 365/154, 365/201, 202, 205, 207
See application file for complete search history.

(56) References Cited

U.S. PATENT DOCUMENTS

| 5,359,226 | A * | 10/1994 | DeJong ............... 257/773 |
| 5,471,429 | A | 11/1995 | Lee et al. |
| 6,275,427 | B1 | 8/2001 | Aipperspach et al. |
| 6,501,692 | B1 | 12/2002 | Melanson et al. |
| 6,643,804 | B1 | 11/2003 | Aipperspach et al. |
| 6,731,179 | B2 | 5/2004 | Abadeer et al. |
| 6,762,961 | B2 | 7/2004 | Eleyan et al. |
| 7,020,035 | B1 * | 3/2006 | Eleyan et al. ............... 365/207 |
| 7,177,201 | B1 | 2/2007 | Takayanagi |
| 2003/0012067 | A1 | 1/2003 | Wong et al. |
| 2003/0036231 | A1 | 2/2003 | Bhattacharya et al. |
| 2003/0198112 | A1 | 10/2003 | Eleyan et al. |
| 2003/0233624 | A1 | 12/2003 | Reddy et al. |
| 2004/0017709 | A1 | 1/2004 | Braceras |
| 2006/0026544 | A1 | 2/2006 | Engel et al. |

FOREIGN PATENT DOCUMENTS

WO    WO 03/090230 A3    10/2003

OTHER PUBLICATIONS

Arsovski et al., U.S. Appl. No. 11/871,198, Office Action Communication, May 13, 2009, 6 Pages.
Arsovski et al., U.S. Appl. No. 11/871,198, Office Action Communication, Dec. 3, 2009, 10 pages.

* cited by examiner

*Primary Examiner*—Jung Hur
(74) *Attorney, Agent, or Firm*—Gibb I.P. Law Firm, LLC; Michael J. LeStrange, Esq.

(57) ABSTRACT

In a method for reducing and/or eliminating mismatch in one or more devices that require a balanced state (e.g., in cross-coupled transistors in each memory cell and/or sense amp in a memory array), the bias (i.e., the preferred state) of each of the devices is determined. Then, a burn-in process is initiated, during which an individually selected state is applied to each of the devices. This fatigues the devices away from their preferred states and towards a balanced state. The bias is periodically reassessed during the burn-in process to avoid over-correction. By using this method both memory cell and sense-amplifier mismatch can be reduced in memory arrays, resulting in smaller timing uncertainty and therefore faster memories.

17 Claims, 9 Drawing Sheets

Prior Art

DEVICE THRESHOLD CALIBRATION THROUGH STATE DEPENDENT BURN-IN

BACKGROUND

1. Field of the Invention

The embodiments of the invention generally relate to devices having cross-coupled latches that require a balanced state. The balanced state being defined by an equal probability of the latch resolving to a "1" or a "0" when the cross-coupled data nodes are initialized to the same voltage. More particularly, this invention relates to a method of compensating for process-induced Random Device Variation (RDV). In addition, this method can also be applied to other threshold sensitive circuitry that can be affected by RDV. Sense-amplifier circuitry that requires matching characteristics between commonly enabled sense-amplifiers can also be calibrated using this approach.

2. Description of the Related Art

As technology scales to sub-micron geometries, Random Device Variation (RDV) is becoming more prominent. That is, as individual devices, such as field effect transistors (FETs), continue to shrink in size (e.g., from approximately 130 nm to 65 nm and below), threshold voltage variations between transistors formed on the same wafer have increased, for example, due to variations in dopant concentrations. These variations can limit the performance and/or reliability of circuits that incorporate such transistors. This is especially evident in the design of circuits with sub-components requiring a balanced state. For example, semiconductor memory arrays, such as static random access memory arrays (SRAMs), incorporate memory cells with cross-coupled transistors that require a balanced state to effectively store data and sense-amplifiers (SA) with cross-coupled transistors that require a balanced state to effectively detect small voltage signals on largely capacitive array lines. Mismatches between the cross-coupled transistors (i.e., variations in threshold voltage, length, width, and other device parameters between the cross-coupled transistors) in both the individual memory cells and the sense-amplifiers can produce incorrect results. Thus, in order to improve reliability, designers of such memory arrays typically tune their sensing circuits conservatively, thereby trading off performance in order to maintain a large sensing margin for reliable operation.

SUMMARY

In view of the foregoing, disclosed herein are embodiments of a method for reducing and/or eliminating mismatch. The embodiments sample the bias of one or more circuit sub-components that require a balanced state (e.g., sampling the bias of the cross-coupled transistors in each memory cell and/or sense amp in a memory array) before chip burn-in, by initiating a burn-in process during which individually selected states are applied to each of the devices in the circuit. This fatigues those devices away from their preferred states and towards a balanced state (e.g., initializing each cell and sense-amplifier to unique states). The bias is periodically reassessed during the burn-in process to avoid over-correction.

More particularly, an embodiment of the invention comprises a method of calibrating a latch or any other such device which can exhibit a preferred state as a result of Random Device Variation (RDV). The device is calibrated after it is manufactured by performing an assessment to determine its preferred state. The preferred state can be either a first state or a second state that is opposite the first state. For example, in a latch the preferred state can be either a high state (e.g., "1") or a low state (e.g., "0"). Additionally, parameters are predetermined for a burn-in process (e.g., a predetermined time period is set for the burn-in process). Then, after the preferred state of the device and the parameters for the burn-in process are determined, the burn-in process can be initiated.

When the burn-in process is initiated, the device is kept in either the first state or the second state depending upon the type of device and, specifically, depending whether keeping the device in the preferred state or in a state opposite the preferred state will fatigue the device towards a balanced state. For example, for a latch-type device, such as a memory cell or a sense-amplifier, keeping the device in the preferred state, during a burn-in process will fatigue the device towards a balanced state.

Furthermore, periodically, during the burn-in process, the device can be reassessed to determine if the preferred state has changed between the first state and the second state so that the device has new preferred state (e.g., to determine if the preferred state of a latch has changed from "0" to "1" or vice versa). If the preferred state has not changed, the burn-in process is continued with the device being kept in the selected state. For example, if the device is a latch-type device, burn-in will continue with the device being kept in the preferred state. However, if the preferred state has changed, the burn-in process continues by the selected state in which the device is kept is switched. For example, if the device is a latch-type device and the preferred state has switched, the burn-in process will continue with the device being kept in the new preferred state.

This method can be employed to calibrate more than one device that is incorporated into a single circuit and that requires a balanced state. For example, it may be employed to calibrate memory cells and/or sense-amplifiers that are incorporated into a memory array or any other devices in a circuit which exhibit a preferred state as a result of RDV). That is, each such device (e.g., each memory cell, each sense amp, etc.) in a circuit can be individually assessed to determine its corresponding preferred state.

As mentioned above, the preferred state can be either a first state or a second state that is opposite the first state towards which the device is skewed away from a balanced state. For example, in a latch-type device such as a memory cell or a sense-amplifier, the preferred state can be either a high state (e.g., "1") or a low state (e.g., "0"). Additionally, parameters are predetermined for a burn-in process (e.g., a predetermined time period is set for the burn-in process). Then, after the corresponding preferred state of each device and the parameters for the burn-in process are determined, the burn-in process can be initiated.

During this burn-in process, each of these devices is kept in either the first state or the second state depending upon the type of device and, specifically, depending whether keeping the device in the preferred state or in a state opposite the preferred state will fatigue the device towards a balanced state. For example, for a latch-type device, such as a memory cell or a sense-amplifier, keeping the device in the preferred state, during a burn-in process will fatigue the device towards a balanced state.

However, periodically, during the burn-in process, each of the devices can be reassessed to determine if its corresponding preferred state has changed between the first state and the second state so that the device has a new corresponding preferred state (e.g., to determine if the corresponding preferred state of any given device has changed from "0" to "1" or vice versa). For any given device, if the corresponding preferred state has not changed, when the burn-in process continues that device will be kept in the originally selected state. For example, for latch-type devices such as memory cells and sense-amplifiers, if the corresponding preferred state has not change, when the burn-in process continues that device will be kept in the original corresponding preferred state. However, for any given device, if the corresponding preferred state has changed, when the burn-in process continues that state in which the device is kept will be switched. For example, for latch-type devices the state in which the device will be kept will be switched from the original corresponding preferred state to the new corresponding preferred state. Frequent reassessment of the preferred state is needed to make sure that each device is not overcorrected and skewed to the opposite state.

More specifically, a memory array (e.g., a conventional static random access memory (SRAM) array) can comprise a plurality of the memory cells that are arranged in columns and rows. Each memory cell in each column can be electrically connected to two bit line and each memory cell in each row can be electrically connected to one word line. Each SRAM cell can be configured with cross-coupled p-type and n-type transistors for storing data. Thus, the memory cells require a balanced state. The memory array can further comprise a plurality of sense-amplifiers. Each sense-amplifier can be electrically connected to the two bit lines for a corresponding one of the columns and can be configured with cross-coupled p-type and n-type transistors for detecting small differences in voltage signals on the largely capacitive bit lines.

In order to individually assess and reassess the bias (i.e., the current preferred state) of each SRAM memory array sense-amplifier, the following processes can be performed. A predetermined voltage (e.g., Vdd or Vdd/2) can be applied to all of the bit lines. Then, the SET signal of each sense-amplifier can be enabled (e.g., in succession). After the SET signal for a particular sense-amplifier is enabled, a determination can be made as to which of the cross-coupled p-type and n-type transistors in that particular sense-amplifier are stronger in order to determine the corresponding preferred state of that particular sense-amplifier. Specifically, after the SET signal is enabled, the stronger n-fet will have a low drain state and a high gate state, the weaker n-fet will have a low gate state, the stronger p-fet will have a high drain state and a low gate state, and the weaker p-fet will have a high gate state. Additionally, a combination of the opposing cross-coupled devices can act together to affect the preferred state. Then, during the burn-in process each sense-amplifier is kept in the preferred state, for example, by keeping the high gate state on the stronger n-fet, the low gate state on the weaker n-fet, the low gate state on the stronger p-fet and the high gate state on the weaker p-fet. This ensures that during the burn-in process less fatigue is applied to the weaker n-fet and the weaker p-fet and more fatigue is applied to the stronger n-fet and the stronger p-fet. Applying more fatigue to the stronger transistors during burn-in weakens them and, thereby, reduces threshold voltage differences between the opposing sides of the cross-coupled transistors.

In order to individually assess and reassess the bias (i.e., the current preferred state) of each of SRAM memory cell, the following processes can be performed. First, the word lines are pulsed sequentially (i.e., word line to word line) at a high state. Meanwhile, all of the bit lines are kept at a predetermined voltage (e.g., ground or Vdd/2). Then, a determination is made as to which of the cross-coupled p-type and n-type transistors in each of the memory cells are stronger and which are weaker so as to determine the corresponding preferred state. Specifically, after a word line connected to a particular memory cell is pulsed, the stronger n-fet in that memory cell will have a low drain state and a high gate state, the weaker n-fet will have a low gate state, the stronger p-fet will have a high drain state and a low gate state, and the weaker p-fet will have a high gate state. As with the sense-amplifiers discussed above, each one of the memory cells is kept in the preferred state during the burn-in by keeping the high gate state on the stronger n-fet, the low gate state on the weaker n-fet, the low gate state on the stronger p-fet and the high gate state on the weaker p-fet. This ensures that during the burn-in process less fatigue is applied to the weaker n-fet and the weaker p-fet and more fatigue is applied to the stronger n-fet and the stronger p-fet. Again, applying more fatigue to the stronger transistors during burn-in weakens them and, thereby, balances the transistors.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, as technology scales to sub-micron geometries Random Device Variation (RDV) is becoming more prominent. That is, as individual devices, such as field effect transistors (FETs), continue to shrink in size (e.g., from approximately 130 nm to 65 nm and below), threshold voltage variations between transistors formed on the same wafer have increased, for example, due to variations in dopant concentrations. These variations can limit the performance and/or reliability of circuits that incorporate such transistors. This is especially evident in the design of circuits with various sub-components requiring a balanced state. For example, semiconductor memory arrays, such as static random access memory arrays (SRAMs), incorporate memory cells with cross-coupled transistors that require a balanced state to effectively store data and sense-amplifiers (SA) with cross-coupled transistors that require a balanced state to effectively detect small voltage signals on largely capacitive array lines. Mismatch between the cross-coupled transistors (i.e., variations in threshold voltages between the cross-coupled transistors) in both the individual memory cells and the sense-amplifiers can produce incorrect results. Thus, in order to improve reliability designers of such memory arrays typically tune their sensing circuits conservatively, thereby, trading off performance in order to maintain a large sensing margin for reliable operation.

Figure 1:
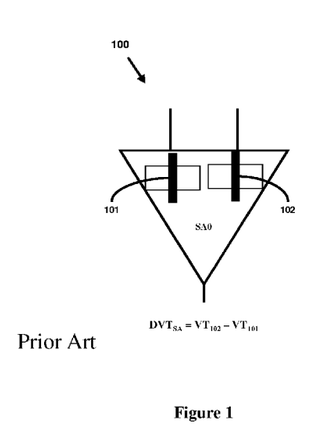
FIG. 1 is a schematic diagram illustrating the critical devices and the process-induced threshold difference between them in an exemplary sense-amplifier.
Figure 2:
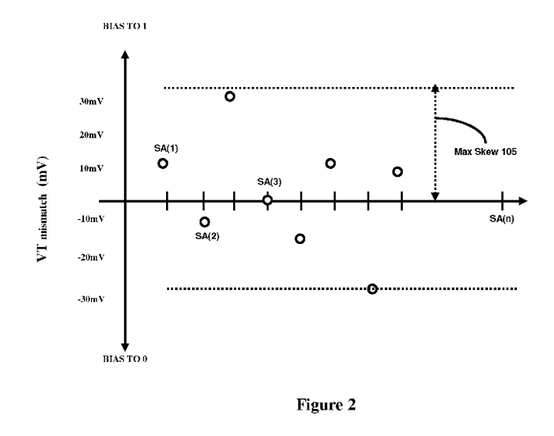
FIG. 2 is a graph illustrating unique threshold voltage mismatch magnitude of multiple on-chip sense-amplifiers.

For example, FIG. 1 illustrates an exemplary sense-amplifier 100 with cross-coupled transistors 101, 102 that may be incorporated into a memory array. The threshold voltage mismatch between transistors 101 and 102 is defined as $DVT_{100}=VT_{101}-VT_{102}$. However, referring to FIG. 2, each sense amp (see SA(1)-SA(n)) that is fabricated on a wafer and incorporated into a memory array may exhibit a different DVT. That is, each sense-amplifier (e.g., $SA_{(1)}$ through $SA_{(n)}$) will be biased toward one state or another (e.g., high (1) or low (0)) with a set skew in millivolts (mV). The maximum skew 105 in one direction or the other is used to decide timing and results capture delay for the entire memory, extending sense-time and reducing performance. Previously, the only way to reduce or eliminate such mismatch was to increase the size of the individual sense amps, which, in turn, increases the overall chip area.

Figure 3:
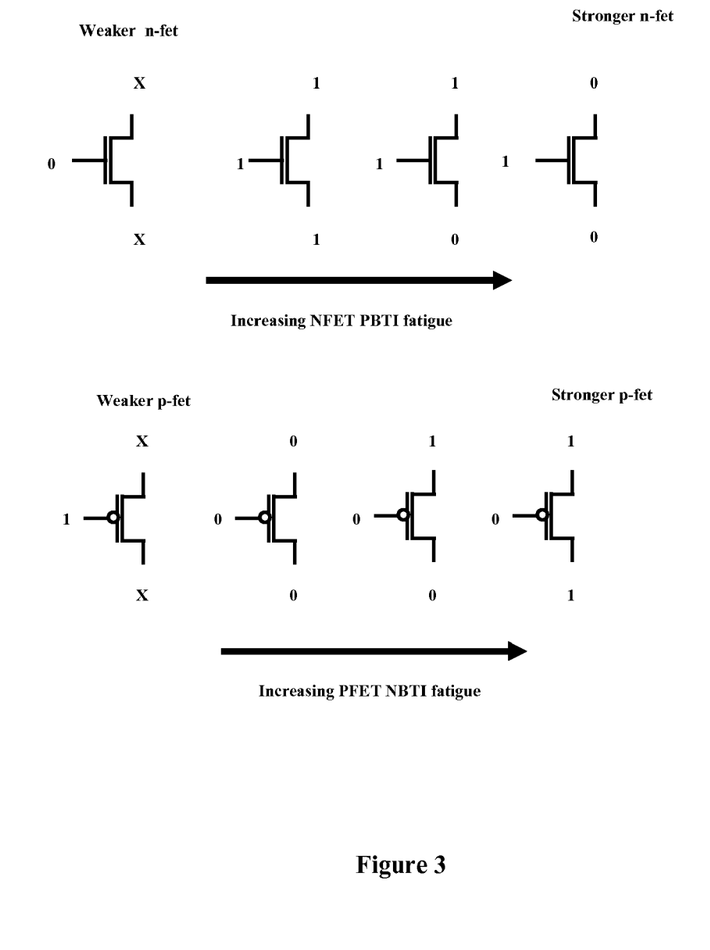
FIG. 3 is a schematic diagram illustrating the BURN-IN fatigue magnitude associated with various NFET and PFET BURN-IN states.

However, referring to FIG. 3 it has been observed that the state (e.g., high (1) or low (0)) in which a particular device (e.g., an n-type field effect transistor (n-fet) or p-type field effect transistor (p-fet)) is fatigued will result in different levels of degradation. Specifically, it has been observed that weaker n-fets with a low gate state (e.g., a "0" gate state) will experience less positive bias temperature instability (PBTI) fatigue than stronger n-fets with a high gate state (e.g., a "1" gate state). Furthermore, n-fets with a high source/drain states will experience less PBTI fatigue than stronger n-fets with one or more low source/drain states. Similarly, it has been observed that weaker p-fets with a high gate state will experience less negative bias temperature instability (NBTI) than stronger p-fets with a low gate state. Furthermore, p-fets with low source/drain states will experience less NBTI than stronger p-fets with one or more high source/drain states. Thus, a perfectly matched sense-amplifier that is fatigued while storing a binary '1' state in its latch will have a positive bias toward the opposite state. This suggests a threshold shift in that direction.

The present invention takes advantage of this observation and comprises a method embodiments for reducing and/or eliminating mismatch by sampling the bias of each circuit sub-component that requires a balanced state (e.g., sampling the bias of the cross-coupled transistors in each memory cell and/or sense amp in a memory array) before chip burn-in, by initiating a burn-in process during which that preferred state is applied, by periodically reassessing the bias and by continuing the burn-in during which the current preferred state is applied.

In view of the foregoing, disclosed herein are embodiments of a method for reducing and/or eliminating mismatch. The embodiments sample the bias of one or more circuit sub-components that require a balanced state (e.g., sampling the bias of the cross-coupled transistors in each memory cell and/or sense amp in a memory array) before chip burn-in, by initiating a burn-in process during which individually selected states are applied to each of the devices in the circuit. This fatigues the devices away from their preferred states and towards a balanced state. The bias is periodically reassessed during the burn-in process to avoid over-correction.

Figure 4:
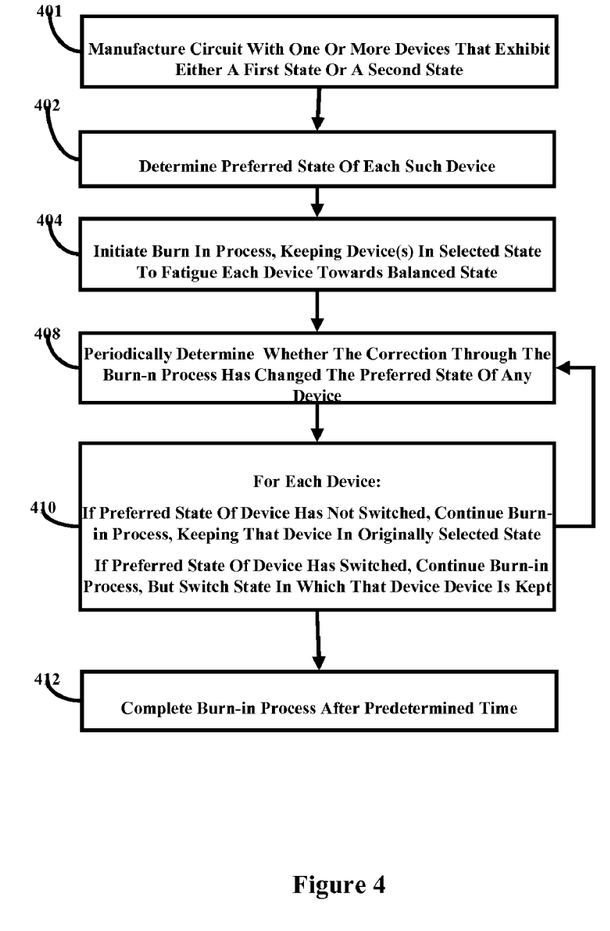
FIG. 4 is a schematic flow diagram illustrating an embodiment of the method.

More particularly, referring to FIG. 4, an embodiment of the invention comprises manufacturing an on-chip circuit comprising at least one device requiring a balanced state, for example, a latch or any other device which can exhibit a preferred state as a result of Random Device Variation (RDV) (401). The preferred state being one of a first state and a second opposite state towards which said device is skewed away from a balanced state. The method then comprises calibrating the device (e.g., reducing or eliminating threshold voltage mismatch so that the device state is balanced).

Calibrating the device can be accomplished by first assessing the device to determine its preferred state (402). As mentioned above, the preferred state can be either a first state or a second state that is opposite the first state towards which the device is skewed away from a balanced state. For example, the preferred state of a latch can be either a high state (e.g., "1") or a low state (e.g., "0").

Additionally, parameters are predetermined for a burn-in process. Those skilled in the art will recognize that a burn-in process is a process during which components of a circuit are exercised (i.e., stressed) by the performance of production tests across a range of temperatures and voltages for a predetermined period of time. Burn-in ensures reliability of in-service chips by forcing failures in weaker chips prior to their being placed in service.

Then, after the preferred state of the device and the parameters for the burn-in process are determined, the burn-in process can be initiated (404). When the burn-in process is initiated, the device is kept in a selected state (e.g., either the first state or the second state). The selected state is selected depending upon the type of device and, specifically, depending whether keeping the device in the preferred state or in a state opposite the preferred state will fatigue the device towards a balanced state. For example, for a latch-type device, such as a memory cell 610 (see FIG. 8) or a sense-amplifier 620 (see FIG. 7), keeping the device in the preferred state, during a burn-in process will fatigue the device towards a balanced state.

That is, keeping a latch-type device in the preferred state degrades stronger transistors within the latch faster than weaker transistors.

However, periodically, during the burn-in process, the device can be reassessed to determine if the preferred state has changed between the first state and the second state so that the device has a new preferred state (e.g., to determine if the preferred state of a latch has changed from "0" to "1" or vice versa) (408). If the preferred state has not changed, the burn-in process is continued with the device being kept in the originally selected state. For example, for a latch-type device, the burn-in process will continue with the latch being kept in the original preferred state. But, if the preferred state has changed, the burn-in process continues, but the selected state in which the device is kept is switched (410). For example, for a latch-type device, the burn-in process will continue but the device will now be kept in the new preferred state. Thus, over correction is minimized. The burn-in process continues as determined by preset parameters (412).

This method can be employed to calibrate more than one device that is incorporated into a single circuit and that requires a balanced state. For example, it may be employed to calibrate memory cells and/or sense-amplifiers that are incorporated into a manufactured memory array or any other devices in a circuit which exhibit a preferred state as a result of RDV (401). That is, each such device (e.g., each memory cell and/or each sense amp or other device) in a circuit (e.g., a memory array) can be individually assessed to determine its corresponding preferred state (402). As mentioned above, the preferred state can be either a first state or a second state that is opposite the first state. For example, the preferred state can be either a high state (e.g., "1") or a low state (e.g., "0").

Additionally, parameters are predetermined for a burn-in process. For example, as discussed above, these parameters can include the tests to be performed during the burn-in process as well as the temperature ranges, the voltages ranges and the time period for the burn-in process.

Then, after the corresponding preferred state of each device and the parameters for the burn-in process are determined, the burn-in process can be initiated (404). During this burn-in process, each of these devices is kept in a selected state (e.g., either the first state or the second state). The selected state is selected depending upon the type of device and, specifically, depending whether keeping the device in the preferred state or in a state opposite the preferred state will fatigue the device towards a balanced state. For example, for a latch-type device, such as a memory cell 610 (see FIG. 8) or a sense-amplifier 620 (see FIG. 7), keeping the device in the preferred state, during a burn-in process will fatigue the device towards a balanced state. That is, keeping a latch-type device in the preferred state degrades stronger transistors within the latch faster than weaker transistors.

However, periodically, during the burn-in process, each of the devices can be reassessed to determine if its corresponding preferred state has changed between the first state and the second state so that the device has a new corresponding preferred state (e.g., to determine if the corresponding preferred state of any given device has changed from "0" to "1" or vice versa) (408). For any given device in the circuit, if the corresponding preferred state has not changed, when the burn-in process continues that device will be kept in the originally selected state. For example, latch-type devices, such as sense-amplifiers and memory cells in a memory array, that do not switch preferred states, will be kept in their original preferred states when the burn-in process continues. Additionally, for any given device, if the corresponding preferred state has changed, when the burn-in process continues the selected state in which that device will be kept is switched. For example, latch-type devices, such as sense-amplifiers and memory cells in a memory array, that switch preferred states will be kept in their new corresponding preferred states when the burn-in process continues (410).

Figure 5:
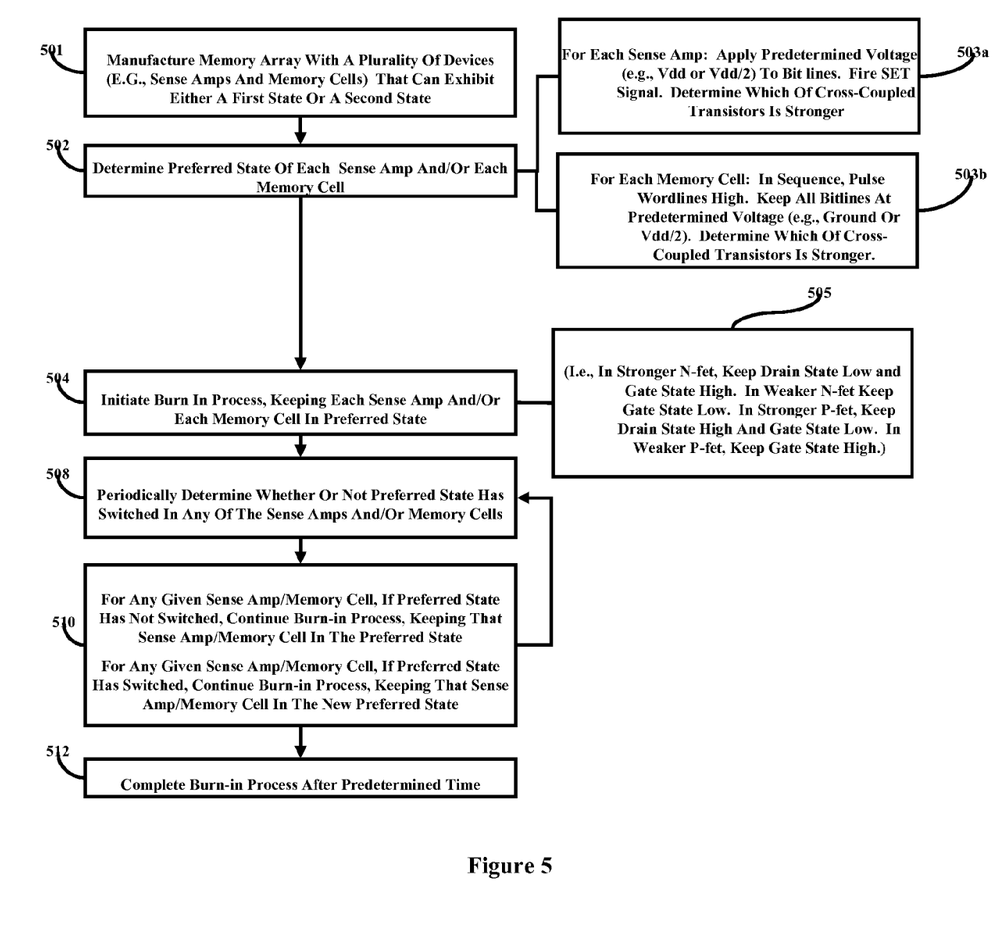
FIG. 5 is a schematic flow diagram illustrating another embodiment of the method.
Figure 6:
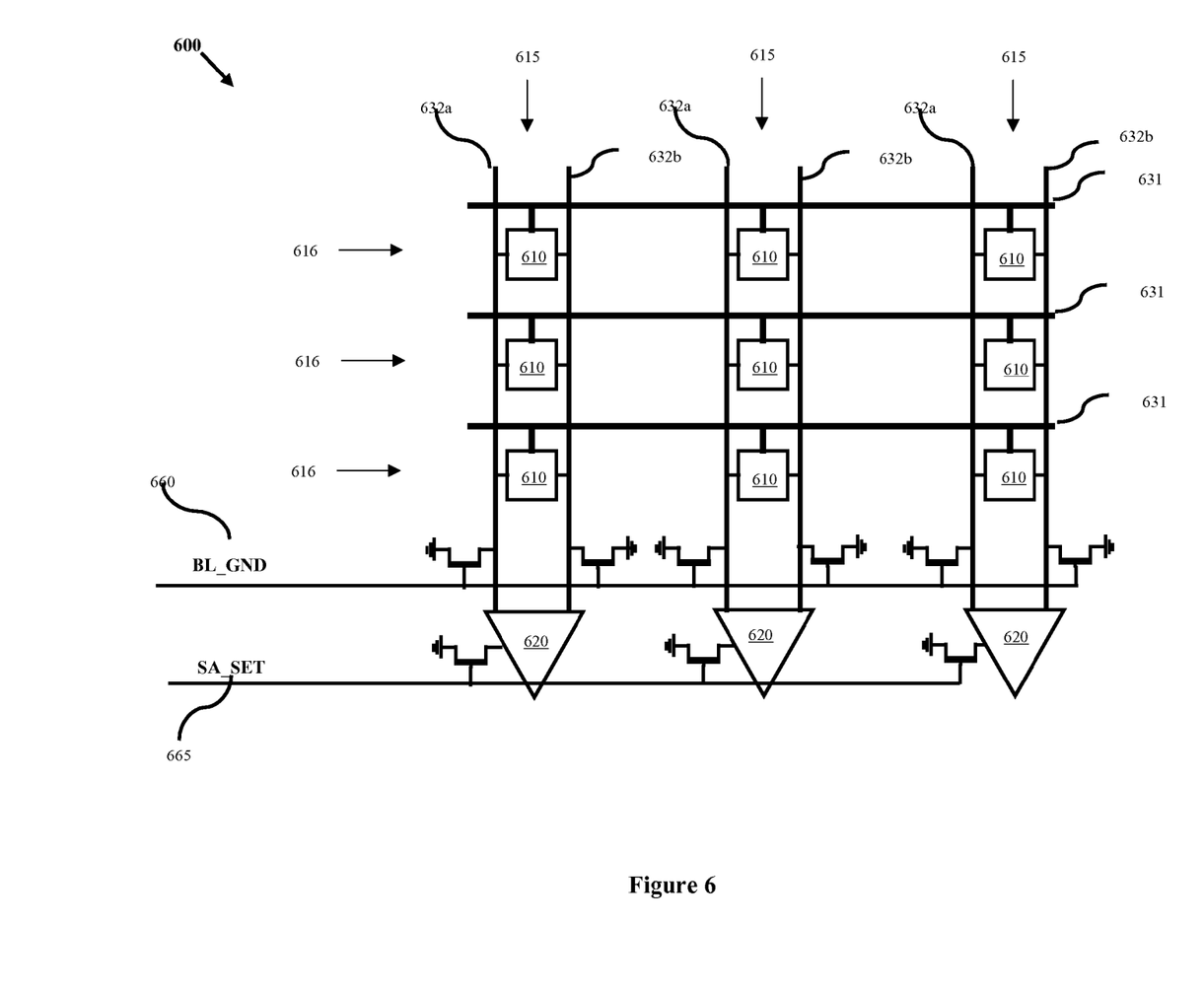
FIG. 6 is a schematic circuit diagram illustrating an exemplary memory array.

More specifically, referring to FIG. 5 in combination with FIG. 6, at process 501 a memory array (e.g., a conventional static random access memory (SRAM) array) 600 is provided that can comprise a plurality of the memory cells 610 that are arranged in columns 615 and rows 616. Each memory cell 610 in each column can be electrically connected to two bit-lines 632a-b and each memory cell 610 in each row 616 can be electrically connected to one word line 631. Each SRAM cell 610 can be configured with cross-coupled p-type and n-type transistors 851-854 for storing data (see FIG. 8). Thus, the memory cells 610 require a balanced state. The memory array 600 can further comprise a plurality of sense-amplifiers 620. Each sense-amplifier 620 can be electrically connected to the two bit lines 632a-b for a corresponding one of the columns 615 and can be configured with cross-coupled p-type and n-type transistors 751-754 for detecting small differences in voltage signals on the largely capacitive bit lines (see FIG. 7).

Then, the preferred state of each of the sense-amplifiers and each of the memory cells in the memory array are individually assessed (502).

In order to individually assess and reassess the bias (i.e., the current preferred state) of each SRAM memory array sense-amplifier 620, the following processes can be performed (503a, see FIGS. 6 and 7 in combination) A predetermined voltage (e.g., Vdd or Vdd/2) can be applied to all of the bit lines 632a-b. Then, the SET signal 665 of each sense-amplifier can be enabled (e.g., in succession). After the SET signal 665 for a particular sense-amplifier is enabled, a determination can be made as to which of the cross-coupled p-type and n-type transistors 751-754 in that particular sense-amplifier are stronger in order to determine the corresponding preferred state of that particular sense-amplifier. Specifically, the stronger pull-down n-fet will bring its drain to "0", while the weaker n-fet will keep it at Vdd. That is, after the SET signal is enabled, the stronger n-fet will have a low ("0") drain state and a high ("1") gate state (see item 751), the weaker n-fet will have a low ("0") gate state (see item 752), the stronger p-fet will have a high ("1") drain state and a low ("0") gate state (see item 753), and the weaker p-fet will have a high ("1") gate state (see item 754).

Figure 7:
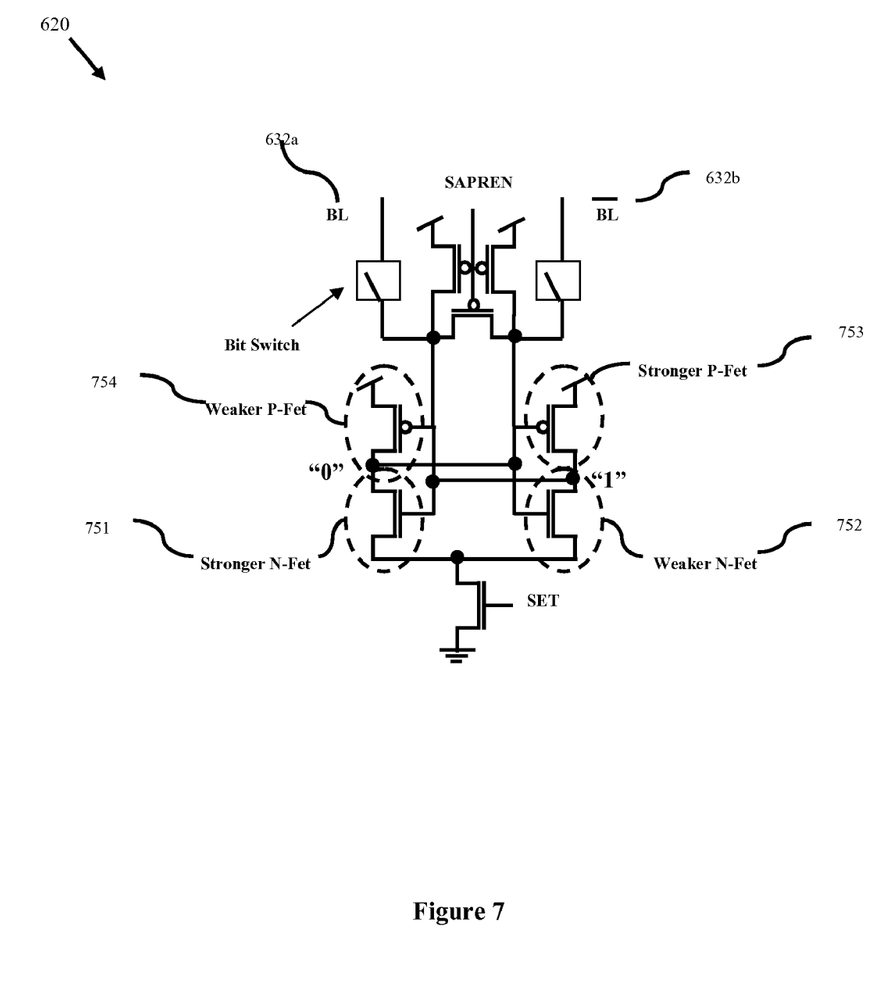
FIG. 7 is a schematic circuit diagram illustrating an exemplary sense-amplifier that can be incorporated into the memory array of FIG. 6.

Then, during the burn-in process (504-505) each sense-amplifier is kept in the preferred state by keeping the high ("1") gate state on the stronger n-fet 751, the low ("0") gate state on the weaker n-fet 752, the low ("0") gate state on the stronger p-fet 753 and the high ("1") gate state on the weaker p-fet 754. This ensures that during the burn-in process less fatigue is applied to the weaker n-fet 752 and the weaker p-fet 754 and more fatigue is applied to the stronger n-fet 751 and the stronger p-fet 753. As illustrated in FIG. 3, applying more fatigue to the stronger transistors 751 and 753 during burn-in weakens them at a faster pace and, thereby, reduces threshold voltage differences.

Figure 8:
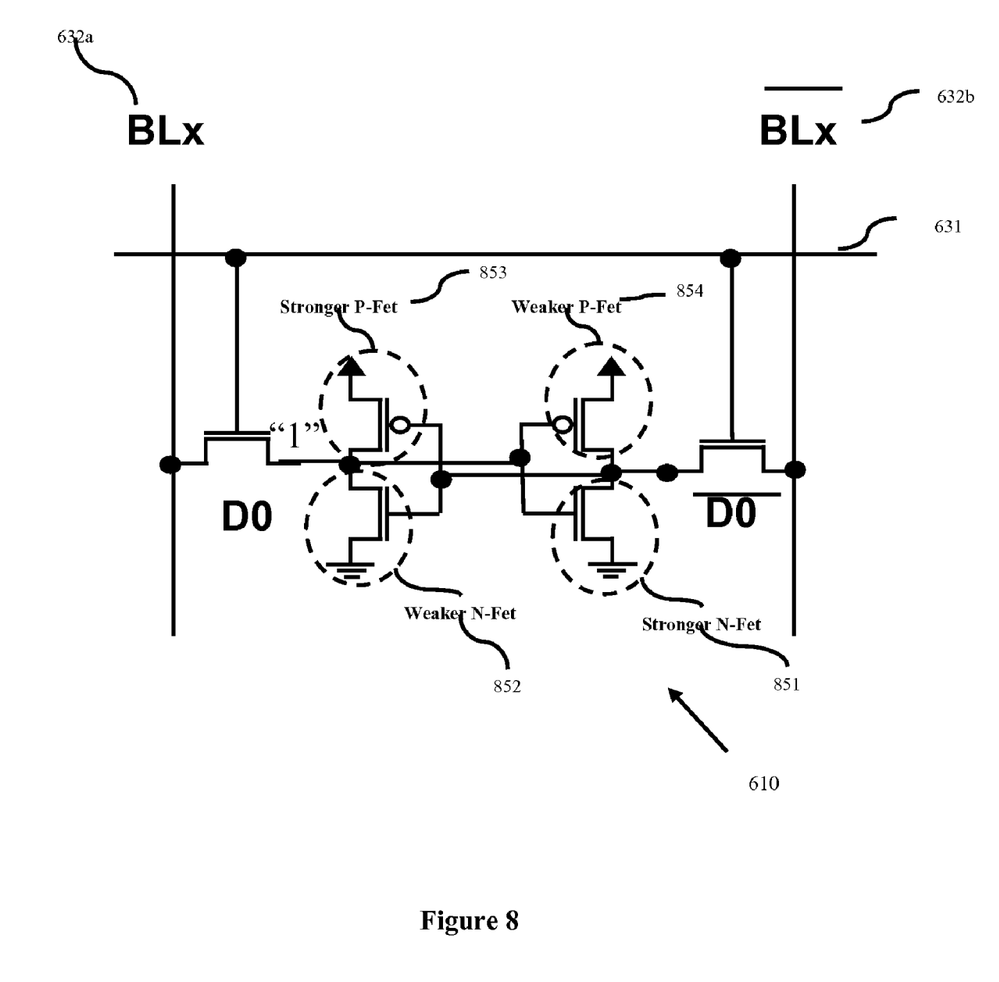
FIG. 8 is a schematic circuit diagram illustrating an exemplary memory cell that can be incorporated into the memory array of FIG. 6.

In order to individually assess and reassess the bias (i.e., the current preferred state) of each of SRAM memory cell 610, the following processes can be performed (503b, see FIGS. 6 and 8). First, the word lines 631 are pulsed sequentially (i.e., word line to word line) at a high ("1") state. Meanwhile, all of the bit lines 632a-b are kept at a predetermined voltage (e.g., ground 660 or Vdd/2). Mismatch-induced asymmetric behavior will cause the preferred cell direction to get latched. Then, a determination is made as to which of the cross-coupled p-type and n-type transistors 851-854 in each of the memory cells 610 are stronger and which are weaker so as to determine the corresponding preferred state. Specifically, after a word line 631 connected to a particular memory cell 610 is pulsed, the stronger n-fet in that memory cell will have a low ("0") drain state and a high ("1") gate state (see item 851), the weaker n-fet will have a low ("0") gate state (see item 852), the stronger p-fet will have a high ("1") drain state and a low ("0") gate state (see item 853), and the weaker p-fet will have a high ("1") gate state (see item 854).

As with the sense-amplifiers 620 discussed above, each one of the memory cells 610 is kept in the preferred state during the burn-in (504-505) by keeping the high ("1") gate state on the stronger n-fet 851, the low ("0") gate state on the weaker n-fet 852, the low ("0") gate state on the stronger p-fet 853 and the high ("1") gate state on the weaker p-fet 854. This ensures that during the burn-in process less fatigue is applied to the weaker n-fet 852 and the weaker p-fet 854 and more fatigue is applied to the stronger n-fet 851 and the stronger p-fet 853. Again, applying more fatigue to the stronger transistors 851, 853 during burn-in weakens them at a faster pace and, thereby, balances the transistors.

Periodically, during the burn-in process, each of the devices can be reassessed, as discussed above, to determine if its corresponding preferred state has changed between the first state and the second state so that the device has a new corresponding preferred state (e.g., to determine if the corresponding preferred state of any given device has changed from "0" to "1" or vice versa) (508). Any given sense-amplifier or memory cell in the memory array that doesn't switch preferred states, will be kept in its original preferred state when the burn-in process continues. Additionally, any given sense-amplifier or memory cell in the memory array, that switches preferred states will be kept in its new corresponding preferred states when the burn-in process continues (510). The burn-in process is then completed as determined by pre-set parameters (512).

Those skilled in the art will recognize that in order to implement the above-described method a conventional SRAM array will require a control-block modification in order to keep the sense-amplifier SET signal (see item 660 of FIG. 6) enabled during burn-in. Sense-amplifiers 620 are required for asserting all bit lines low/high/and optionally Vdd/2. Furthermore a timing circuit and BIST (built-in self-test) pattern is required to re-assess memory cell and sense-amplifier bias, as described above at process 505a-b.

Figure 9:
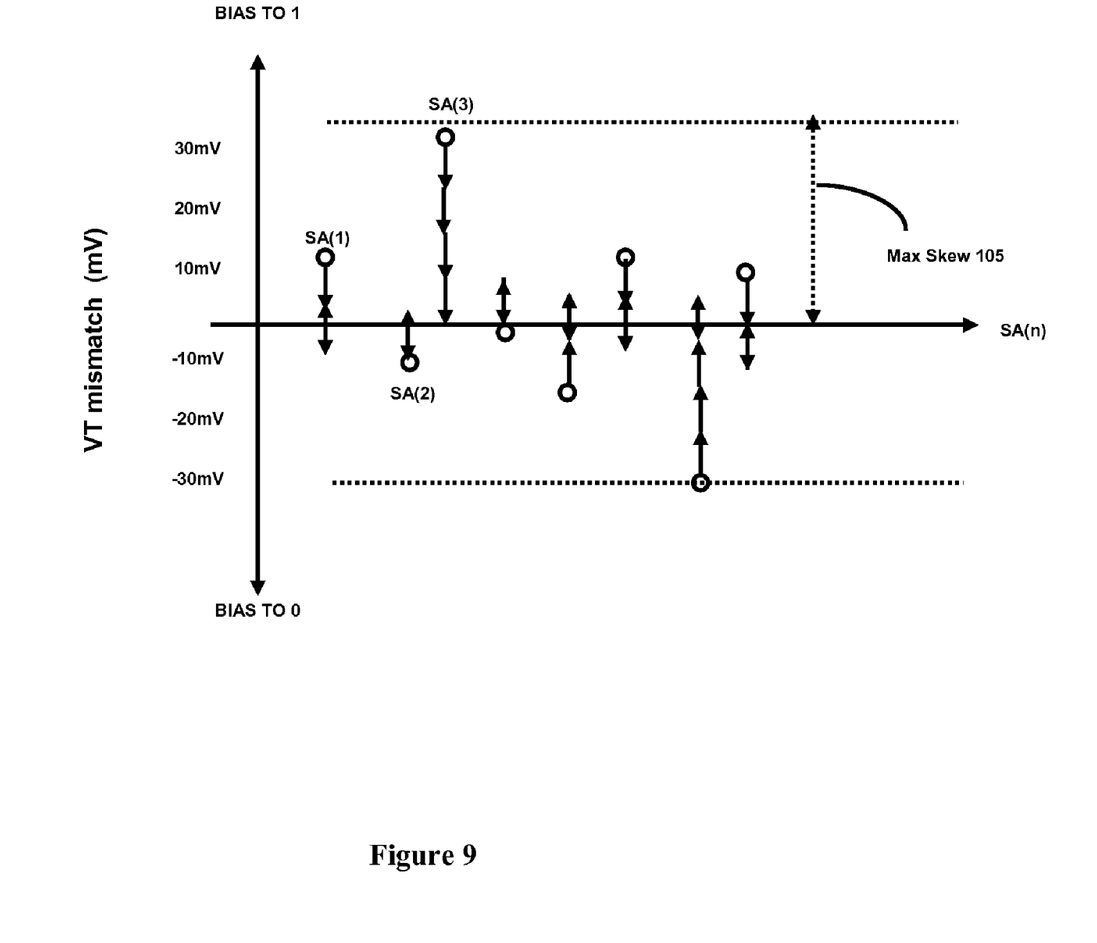
FIG. 9 is a schematic graph illustrating reduction of threshold mismatch through burn-in in multiple on-chip sense-amplifiers.

Furthermore, smaller predetermined time steps (t) between preferred state reassessments at process 508 allow for smaller mismatch in post-burn-in products. (i.e., over correction is minimized). That is, to prevent overstress during the burn-in process, all memory cells 610 and sense-amplifiers 620 are repeatedly re-assessed for bias and set to the current preferred state for the next interval of burn-in at process 510. Referring to FIG. 9, the devices (e.g., SA(1)-SA(n)) that were close to the 0 mV mismatch (e.g., SA(2)) will switch preferred states at each burn-in interval, remaining at around the 0 mV mismatch mark. However, devices that begin the burn-in process with a large mismatch (e.g., SA(3)) will stay in the same state during the entire burn-in process, slowly converging on the 0 mV mismatch mark. The burn-in time step after re-assessment determines the maximum error 106 in threshold voltage mismatch.

Figure 10:
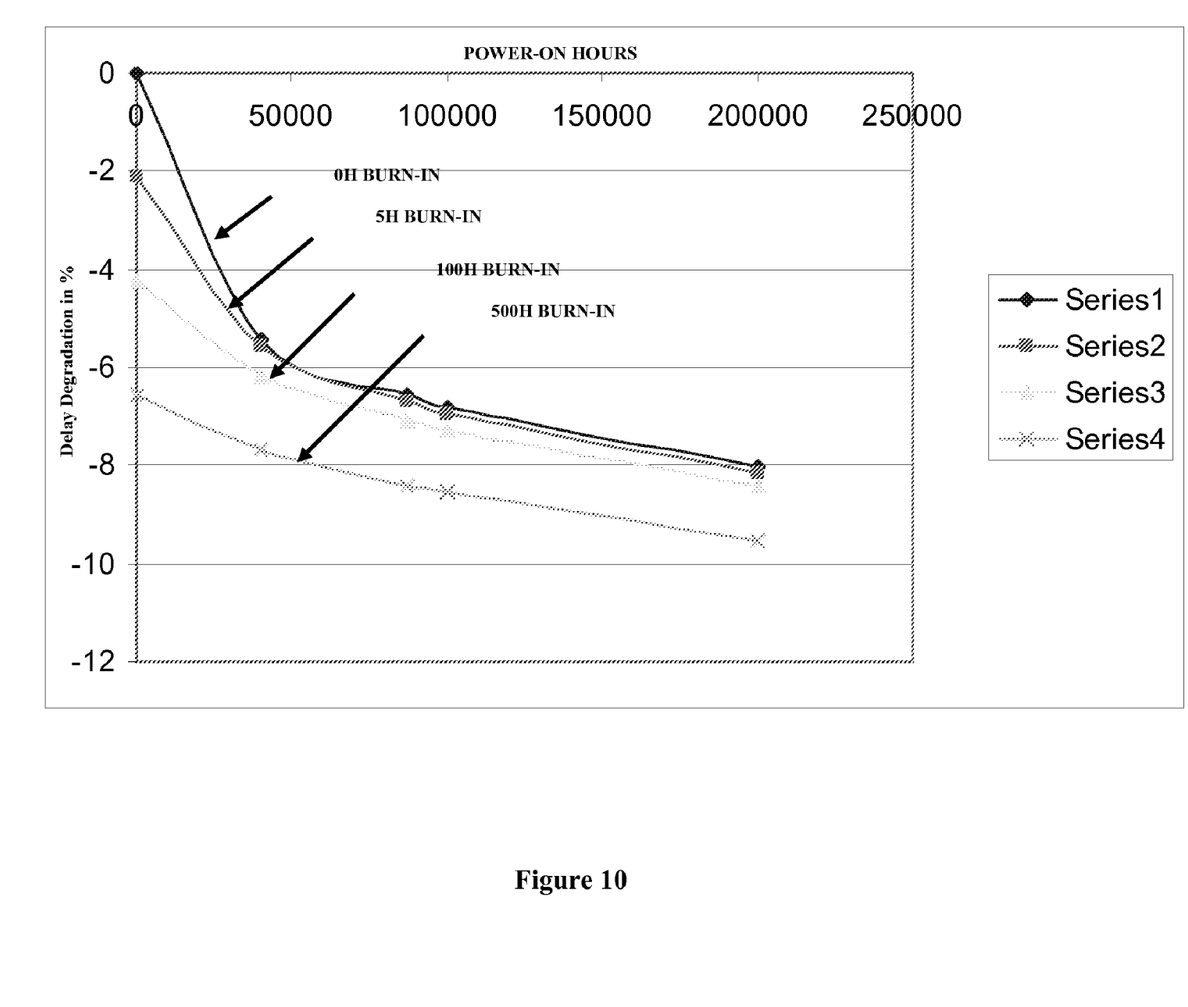
FIG. 10 is a schematic graph illustrating retention of burn-in correction for individual BURN-IN timesteps.

The above-described method reduces or eliminates random variation (e.g., of up to 45 mV for p-fets) in SRAM cells 610 and sense-amplifiers 620 through state-dependent burn-in by fatiguing stronger devices and sparing weaker devices. Furthermore, referring to FIG. 10, the correction achieved by the above-described method is retained over the life of the product. That is, the difference in burn-in hours is evident even after 200 KPH of operation, implying that a burn-in skew introduced at time zero will persist until through the life of the product.

The above-described method can be implemented for use with a circuit comprising device(s) that allow for the assessment of manufactured bias (i.e., devices in which a preferred state can be detected) and that can hold that preferred state during burn-in. For example single ended sense-amplifiers can be calibrated using the above-described method using additional circuits that provide variable sensing voltage to the sense-amplifiers and have the ability to hold a specific sense-line voltage for the duration of the burn-in. Additionally, in low PBTI degradation processes, circuits can be designed to allow calibration through p-fet devices. Furthermore, while the embodiments of the method of the invention are described for use in calibrating cross-coupled latch memory circuits, this method may also be used for calibrating any other circuit that is designed to allow post-manufacture determination to be made regarding skew introduce by RDV and to allow the circuit to be held in a state which will introduce the sought after correction.

Therefore, disclosed above are embodiments of a method for reducing and/or eliminating mismatch. The embodiments sample the bias of one or more circuit sub-components that require a balanced state (e.g., sampling the bias of the cross-coupled transistors in each memory cell and/or sense amp in a memory array or any other device that requires a balanced state in a circuit) before chip burn-in, by initiating a burn-in process during which individually selected states are applied to each of the devices in the circuit. This fatigues the devices away form their preferred states and towards a balanced state. The bias is periodically reassessed during the burn-in process to avoid over-correction. By using this method both memory cell and sense-amplifier random device mismatch can be significantly reduced in memory arrays, resulting in better data retention at low voltages for the SRAM memory cells and smaller timing uncertainty in sense-amplifier circuits that result in faster and memories.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A method of calibrating a device, said method comprising:

assessing said device, said device comprising cross-coupled transistors requiring a balanced state when said cross-coupled transistors are initialized to a same predetermined voltage and said assessing being performed to determine a current preferred state towards which said device is skewed away from said balanced state when said cross-coupled transistors are initialized to said same predetermined voltage, wherein said current preferred state is one of a first state and a second state opposite said first state;

initiating a burn-in process with said device in a selected one of said first state and said second state and with said cross-coupled transistors initialized to said same predetermined voltage such that, during said burn-in process, said device is fatigued away from said current preferred state towards said balanced state; and during said burn-in process, repeatedly reassessing said device to determine if said current preferred state has changed and, if said current preferred state has changed, switching said device to an opposite state from said selected one of said first state and said second state.

2. The method of claim 1, further comprising, during said burn-in process, if said current preferred state has not changed, continuing to keep said device in said selected one of said first state and said second state.

3. The method of claim 1, further comprising setting a time period for said burn-in process and performing said repeatedly reassessing and said switching during said time period.

4. A method of calibrating a plurality of devices in a circuit, said method comprising:

assessing each of said devices, each device comprising cross-coupled transistors requiring a balanced state when said cross-coupled transistors are initialized to a same predetermined voltage and said assessing being performed to determine corresponding current preferred states towards which each of said devices are skewed from said balanced state when said cross-coupled transistors are initialized to said same predetermined voltage, said corresponding current preferred states each being one of a first state and a second state opposite said first state;

initiating a burn-in process with each one of said devices in a corresponding selected one of said first state and said second state and with said cross-coupled transistors initialized to said same predetermined voltage such that, during said burn-in process, said devices are fatigued away from said corresponding current preferred states towards said balanced state; and during said burn-in process, repeatedly reassessing each of said devices to determine if any of said corresponding current preferred states of any of said devices have changed and, for each device having a changed preferred state, switching said device to an opposite state from said corresponding selected one of said first state and said second state.

5. The method of claim 4, further comprising, during said burn-in process, for each device having an unchanged preferred state, continuing to keep said device in said selected one of said first state and said second state.

6. The method of claim 4, further comprising setting a time period for said burn-in process and performing said repeatedly reassessing and said switching during said time period.

7. A method of calibrating a plurality of devices in a memory array, said method comprising:

assessing each of said devices, each device comprising cross-coupled transistors requiring a balanced state when said cross-coupled transistors are initialized to a same predetermined voltage and said assessing being performed to determine, for each of said devices, corresponding current preferred states towards which each of said devices are skewed from said balanced state when said cross-coupled transistors are initialized to said same predetermined voltage, said corresponding current preferred states each being one of a first state and a second state opposite said first state and wherein said devices comprise at least one of memory cells and sense-amplifiers;

initiating a burn-in process with said devices in said corresponding current preferred states and with said cross-coupled transistors initialized to said same predetermined voltage such that, during said burn-in process, said devices are fatigued away from said corresponding current preferred states towards said balanced state; and during said burn-in process, repeatedly reassessing each of said devices to determine if any of said corresponding current preferred states of any of said devices have changed and, for each device having a changed preferred state, switching said device to said changed preferred state.

8. The method of claim 7, further comprising, during said burn-in process, for each device having an unchanged preferred state, continuing to keep said device in said unchanged preferred state.

9. The method of claim 7, further comprising setting a time period for said burn-in process and performing said repeatedly reassessing and said switching during said time period.

10. The method of claim 7, wherein said memory array comprises a plurality of said memory cells arranged in columns with each memory cell in a column electrically connected to two bit lines and further arranged in rows with each memory cell in a row electrically connected to one word line, wherein said memory array further comprises a plurality of sense-amplifiers, and wherein each one of said sense-amplifiers is electrically connected to said two bit lines for a corresponding one of said columns.

11. The method of claim 10, wherein each one of said sense-amplifiers comprises cross-coupled p-type and n-type transistors and wherein said assessing of each of said devices comprises individually assessing each of said sense-amplifiers by performing the following:

applying a predetermined voltage to all of said bit lines;

successively firing a SET signal of each of said sense-amplifiers; and determining which of said cross-coupled p-type and n-type transistors in each of said sense-amplifiers are stronger and which are weaker so as to determine said corresponding preferred state.

12. The method of claim 11, wherein said predetermined voltage comprises one of Vdd and Vdd/2.

13. The method of claim 11, wherein, after firing said SET signal, in each of said sense-amplifiers, a stronger n-fet will have a low drain state and a high gate state and a weaker n-fet will have a low gate state, a stronger p-fet will have a high drain state and a low gate state, and a weaker p-fet will have a high gate state, and wherein each one of said sense-amplifiers is kept in said preferred state during said burn-in by keeping said high gate state on said stronger n-fet, said low gate state on said weaker n-fet, said low gate state on said stronger p-fet and said high gate state on said weaker p-fet such that during said burn-in less fatigue is applied to said weaker n-fet and said weaker p-fet and more fatigue is applied to said stronger n-fet and said stronger p-fet.

14. The method of claim 10, wherein each one of said memory cells comprises cross-coupled p-type and n-type transistors and wherein said assessing of each of said devices comprises individually assessing each of said memory cells by performing the following:

pulsing a high state to said word lines;
keeping all of said bit lines at an equal predetermined voltage; and
determining which of said cross-coupled p-type and n-type transistors in each of said memory cells are stronger and which are weaker so as to determine said corresponding preferred state.

15. The method of claim 14, wherein said pulsing comprises pulsing said word lines sequentially.

16. The method of claim 14, wherein said predetermined voltage comprises one of ground and Vdd/2.

17. The method of claim 14, wherein, after pulsing said word lines, in each of said memory cells a stronger n-fet will have a low drain state and a high gate state, a weaker n-fet will have a low gate state, a stronger p-fet will have a high drain state and a low gate state, and a weaker p-fet will have a high gate state, and wherein each one of said memory cells is kept in said preferred state during said burn-in by keeping said high gate state on said stronger n-fet, said low gate state on said weaker n-fet, said low gate state on said stronger p-fet and said high gate state on said weaker p-fet such that during said burn-in less fatigue is applied to said weaker n-fet and said weaker p-fet and more fatigue is applied to said stronger n-fet and said stronger p-fet.

* * * * *